United States Patent [19]

Keller et al.

[11] Patent Number: 5,767,628
[45] Date of Patent: Jun. 16, 1998

[54] HELICON PLASMA PROCESSING TOOL UTILIZING A FERROMAGNETIC INDUCTION COIL WITH AN INTERNAL COOLING CHANNEL

[75] Inventors: John Howard Keller, Newburgh; Dennis Keith Coultas, Hopewell Junction, both of N.Y.

[73] Assignee: International Business Machines Corporation, Armonk, N.Y.

[21] Appl. No.: 575,431

[22] Filed: Dec. 20, 1995

[51] Int. Cl.$^6$ .................................................. H05H 1/24
[52] U.S. Cl. ............................. 315/111.51; 118/723 I; 118/723 AN; 343/788
[58] Field of Search ..................... 315/111.21, 111.41, 315/111.51, 111.71; 343/788; 118/723 MR, 723 MA, 723 AN, 723 I, 723 IR

[56] References Cited

U.S. PATENT DOCUMENTS

| | | | |
|---|---|---|---|
| 1,130,260 | 3/1915 | Dann | 336/90 |
| 4,716,491 | 12/1987 | Ohno et al. | 315/111.71 X |
| 4,745,337 | 5/1988 | Pichot et al. | 315/111.41 |
| 4,990,229 | 2/1991 | Campbell et al. | 204/298.06 |
| 5,032,202 | 7/1991 | Tsai et al. | 156/345 |
| 5,081,398 | 1/1992 | Asmussen et al. | 315/111.41 |
| 5,122,251 | 6/1992 | Campbell et al. | 204/298.06 |
| 5,133,825 | 7/1992 | Hakamata et al. | 156/646 |
| 5,203,960 | 4/1993 | Dandl | 156/643 |
| 5,304,279 | 4/1994 | Coultas et al. | 156/345 |
| 5,304,282 | 4/1994 | Flamm | 156/643 |
| 5,557,172 | 9/1996 | Tanaka | 315/111.71 |
| 5,648,701 | 7/1997 | Hooke et al. | 315/111.71 X |

FOREIGN PATENT DOCUMENTS 1246138  8/1967  Germany ................ 315/111.51

OTHER PUBLICATIONS

Technical Disclosure Bulletin, vol. 36, No. 5, Oct. 1992, J. J. Cuomo et al., Compact Microwave Plasma Source, pp. 307–308.

*Primary Examiner*—Robert Pascal
*Assistant Examiner*—Justin P. Bettendorf
*Attorney, Agent, or Firm*—Ira D. Blecker

[57] ABSTRACT

Disclosed is a plasma dry processing apparatus for producing a plasma with a resonance zone including a chamber for plasma processing at least one workpiece, the workpiece situated at a first end of the chamber; an induction coil at a second end of the chamber, spaced from the workpiece, for providing a radio frequency induced electromagnetic magnetic field to generate a helicon plasma within the chamber; a plurality of magnetic dipoles contained within the material of the induction coil, the magnetic dipoles having their fields directed towards the interior of, and producing a well-confined plasma within, the chamber, wherein the fields are adjacent to the second end of the chamber and keep the plasma spaced from the second end of the chamber.

36 Claims, 9 Drawing Sheets

5,767,628

HELICON PLASMA PROCESSING TOOL UTILIZING A FERROMAGNETIC INDUCTION COIL WITH AN INTERNAL COOLING CHANNEL

RELATED APPLICATIONS

This application is related to "Ion Implantation Helicon Plasma Source with Magnetic Dipoles," U.S. patent application Ser. No. 08/575,453, filed even date herewith now U.S. Pat. No. 5,686,796.

BACKGROUND OF THE INVENTION

This invention relates to apparatus for plasma processing of substrates, and more particularly, to subtractive (etching) and additive (deposition) processing of electronic circuit chips and packaging materials.

Plasma discharges are extensively utilized in the fabrication of devices such as semiconductor devices and, in particular, silicon semiconductor devices. By selecting appropriate operating conditions, plasma discharges in appropriate precursor gases may be utilized to induce formation of a solid on a deposition substrate or to remove selected portions of a substrate.

In etching, for example, a pattern is etched into the substrate by utilizing a mask having openings corresponding to this pattern and a suitable plasma. It is desirable to produce etching at an acceptable etch rate. The acceptable etch rate depends upon the material to be removed. Additionally, the production of a relatively high etching rate leads to shorter processing times.

In plasma-assisted deposition procedures, the desired solid is commonly formed by a reactant gas introduced into an evacuated chamber which is immersed in a steady magnetic field and exposed to electromagnetic radiation. For example, a deposition substrate is surrounded by a plasma which supplies charged species for energetic ion bombardment. The plasma tends to aid in rearranging and stabilizing the deposited film provided the bombardment is not sufficiently energetic to damage the underlying substrate or growing film.

Various apparatus for producing the desired plasma discharges have been employed.

Plasma sources employing electron cyclotron resonance (ECR) heating comprise, for example, the deposition on and etching of substrates as explained above. ECR/helicon/magnetron plasma sources such as those provided by the present invention and the prior art discussed below employ magnetic fields and a suitable power source to create chemically active plasmas, preferably at very low gas pressures. Low pressure operation is desirable in order to permit the formation of highly directional or anisotropic streams of low temperature ions which are uniform over substantial transverse dimensions larger than the sample being processed.

Electrons in the interaction region gain kinetic energy from the electromagnetic radiation, and if the radiation power and the gas pressure are suitably adjusted, the heated electrons may ionize the reactant gas molecules to create a plasma. The plasma ions and electrons flow out of the resonant interaction region and impinge on a substrate where the ions can be used for etching of existing films on selected portions of a substrate or deposition of new materials. If the plasma density is sufficiently high, the deposition can be rapid or the etch rates can be rapid, selective and stable, and if the ion and electron energies are sufficiently low, damage to the sample being processed is prevented.

Inductive and ECR plasma generation techniques are capable of producing efficient plasmas at low pressures with much higher densities compared to the conventional RF discharge or non-ECR microwave plasma techniques. The ECR/helicon enhancement also extends the operating process pressure domain down to very low pressures in the high vacuum regime. Inductive and ECR plasma processing is applicable to a wide range of advanced semiconductor device, flat panel and packaging fabrication processes.

Coultas et al. U.S. Pat. No. 5,304,279, the disclosure of which is incorporated by reference herein, discloses a multipole plasma processing tool wherein an RF coil is situated on top of the plasma processing chamber with a plurality of dipole magnets surrounding the plasma processing chamber. Optionally, there may be additional multipole magnets situated adjacent to the RF coil on top of the plasma processing chamber.

Flamm U.S. Pat. No. 5,304,282, the disclosure of which is incorporated by reference herein, discloses a plasma etching and deposition apparatus which comprises an helical coil, means for applying an RF field to the coil and an applied magnetic field.

Campbell et al. U.S. Pat. Nos. 5,122,251 and 4,990,229, the disclosures of which are incorporated by reference herein, disclose a plasma etching and deposition apparatus which comprises an RF-powered antenna to form a non-uniform plasma in an upper plasma chamber which is isolated from the walls of the upper plasma chamber by magnetic coils. The plasma eventually is expanded and made uniform in a lower plasma chamber.

Dandl U.S. Pat. No. 5,203,960, the disclosure of which is incorporated by reference herein, discloses a plasma etching and deposition apparatus comprising a plasma chamber surrounded by a plurality of permanent magnets. Microwave power is injected through slotted waveguides perpendicularly to the longitudinal axis of the plasma chamber.

Assmussen et al. U.S. Pat. No. 5,081,398, the disclosure of which is incorporated by reference herein, discloses a plasma etching and deposition apparatus comprising a quartz plasma chamber wherein microwave power is injected by a coaxial waveguide. Permanent magnets are situated adjacent to the plasma chamber and the region where the electron cyclotron resonance is formed.

Hakimata et al. U.S. Pat. No. 5,133,825, the disclosure of which is incorporated by reference herein, discloses a plasma generating apparatus wherein microwave power is injected coaxially into the plasma chamber. Permanent magnets are directly adjacent to and surround the plasma chamber.

Tsai et al. U.S. Pat. No. 5,032,202, the disclosure of which is incorporated by reference herein, discloses a plasma etching and deposition apparatus comprising a microwave source which forms a plasma in an upper plasma chamber. The plasma is confined by solenoid magnets. The plasma drifts and is expanded in a lower plasma chamber which is surrounded by line cusp permanent magnet columns.

Pichot et al. U.S. Pat. No. 4,745,337, the disclosure of which is incorporated by reference herein, discloses a plasma generating apparatus comprising a microwave source having its antenna within the plasma chamber. IBM Technical Disclosure Bulletin, 35, No. 5, pp. 307–308 (October 1992), the disclosure of which is incorporated by reference herein, is similar to Pichot in that the microwave antenna is located in the plasma chamber.

Notwithstanding the many prior art references, there remains a need for a plasma generating apparatus which efficiently produces a uniform, quiescent plasma that runs at lower pressures and is stable at electron densities of $10^{10}$ and $10^{11}$ electrons/cc.

Accordingly, it is a purpose of the present invention to have a plasma generating apparatus which produces a uniform, quiescent plasma.

It is another purpose of the present invention to have a plasma generating apparatus which is of higher efficiency.

It is yet another purpose of the present invention to have a plasma generating apparatus which runs at lower pressures.

These and other objects of the present invention will become more apparent after referring to the following detailed description of the invention considered in conjunction with the accompanying drawings.

BRIEF SUMMARY OF THE INVENTION

The objects of the invention have been achieved by providing a plasma dry processing apparatus for producing a plasma with a resonance zone comprising:

- a chamber for plasma processing at least one workpiece, said workpiece situated at a first end of said chamber;
- an induction coil at a second end of said chamber, spaced from said workpiece, for providing a radio frequency induced electromagnetic field to generate a helicon plasma within said chamber;
- a plurality of magnetic dipoles contained within the material of said induction coil, said magnetic dipoles having their fields directed towards the interior of, and producing a well-confined plasma within, said chamber, wherein said fields are confined adjacent to said second end of said chamber and keep said plasma spaced from said second end of said chamber.

DETAILED DESCRIPTION OF THE INVENTION

Figure 1A:
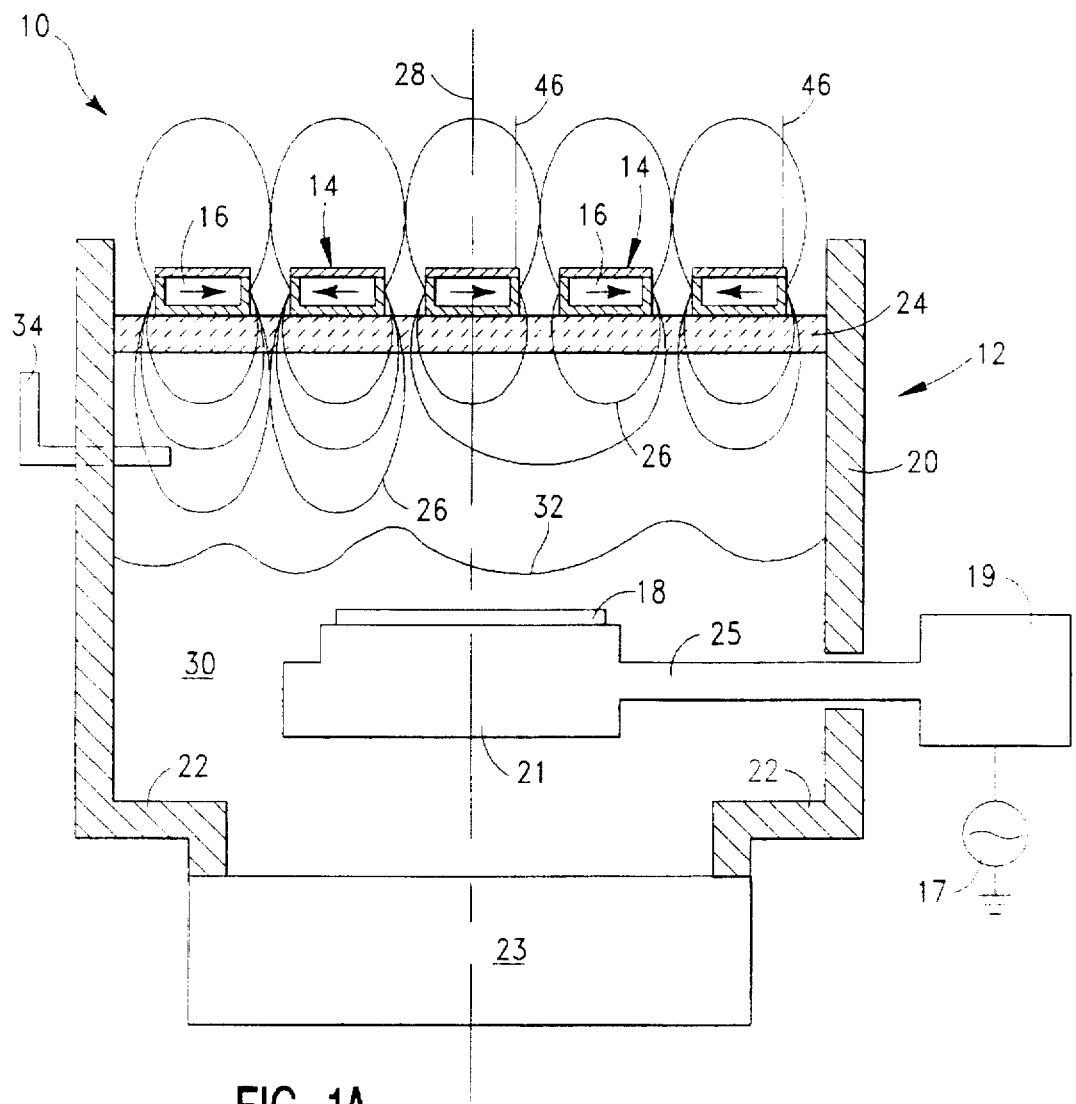
FIG. 1A is a sectional view of a plasma dry processing apparatus according to the present invention and FIG. 1B is a schematic of a matching network.

Referring to the drawings in more detail, and particularly referring to FIG. 1A, there is shown a plasma dry processing apparatus, generally indicated by 10, for producing a plasma with a resonance zone 32. The apparatus 10 includes a chamber 12, an induction coil 14 (also referred to hereafter as an antenna) and a plurality of magnetic dipoles 16.

The chamber 12 is utilized for plasma processing at least one workpiece 18 which may be undergoing additive plasma processing (deposition) or subtractive plasma processing (etching). The chamber 12 may also be utilized as an ion beam source. The workpiece may be, for example, a semiconductor wafer or flat panel. The chamber 12 consists of a vertical section 20, a base 22 and a top section 24. The workpiece 18 may be held with a mechanical chuck or an electrostatic chuck (not shown) which may be helium cooled or heated as determined by the etching or deposition process. The workpiece 18 and chuck are positioned on lift 21. The workpiece 18 may also be biased to increase the energy and directionality of the ions which strike the workpiece 18. This may be done through $\pi$ matching network 27 (see FIG. B) in box 19 and power supply 17. Box 19 also contains the wafer and chuck cooling plumbing and lift electronics which communicate through feedthroughs in arm 25 to the lift 21, chuck and workpiece 18. The chamber is pumped by high vacuum pump 23. The chamber 12 may be any shape such as circular, square or rectangular, although it is preferred that it be circular. Top section 24 supports the planar, induction coil 14 and magnetic dipoles 16. Top section 24 should be transparent to the magnetic field 26 from the magnetic dipoles 16 and the electromagnetic energy from the planar, induction coil 14. For purposes of illustration and not limitation, top section 24 may be made from quartz, alumina or aluminum nitride. Vertical section 20 and base 22 may be made, for example, from anodized aluminum.

Figure 1B:
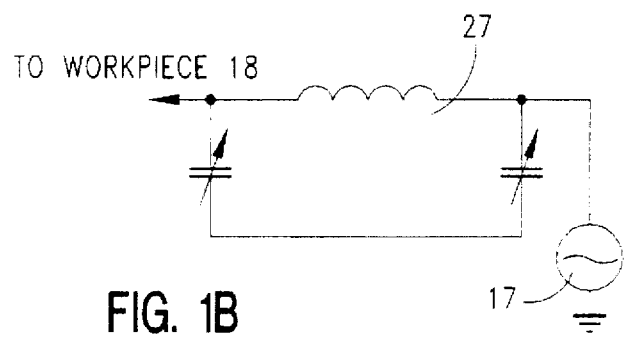

As is apparent from FIG. 1B the induction coil 14 is at the opposite end of the chamber 12 from the workpiece 18 and thus is spaced from the workpiece 18. The shape of the induction coil 14 should be such as to produce a nearly uniform inductive and capacitive coupling to the plasma 30. Thus, at the middle radius of the coil, the spacing between turns can be increased to reduce the inductive fields at this location. It is preferred that the induction coil 14 is located on the exterior of the chamber 12 so as to avoid any contamination of the plasma 30.

A suitable gas (not shown) is introduced into the chamber 12 through tube 34. Suitable gases include, for example, $Cl_2$, HBr, $SF_6$, $C_3F_8+16\%\ SF_6$, $C_3F_8$, $CF_4$, $O_2$, and Ar $+O_2$. It is to be understood that there usually is associated with tube 34 sufficient apparatus (not shown) for supplying the gas at a relatively uniform pressure about the entire circumference of the top of chamber 12. Preferably, the pressure of the gas in chamber 12 is at a low pressure of about 1–5 mTorr.

The induction coil 14 provides a radio frequency (RF) induced field to generate within the chamber 12 an inductive/helicon plasma 30. Electrical power may be supplied to the planar, spiral induction coil 14 by leads 46 leading to source (not shown). The coil is energized by a 13.56 MHz radio frequency source with a power of about 200 to 2000 watts. Other radio frequencies such as 400 KHz to 40 MHz may also be utilized. The RF energy from the coil 14 ionizes the gas in chamber 12 into a sustained helicon plasma for additive or subtractive processing of the workpiece 18. The plasma 30 may also be utilized as an ion beam source.

Contained within the material of the induction coil 14 are a plurality of magnetic dipoles 16. The plurality of magnetic dipoles 16 are made from permanent magnets, such as barium ferrite, strontium ferrite or samarium cobalt, instead of being electromagnets. The magnetic dipoles 16 have their magnetic fields 26 directed toward the interior of the chamber 12. As can be seen, the plurality of magnetic dipoles 16 have their north and south poles oriented parallel to the plasma and perpendicular to vertical axis 28. The magnetic fields 26 are confined adjacent to the top section 24 of the chamber 12. With this arrangement, the plurality of magnetic dipoles 16 provide a wall of magnetic field forces which repel electrons back into the interior of chamber 12, thereby reducing the number of activated ions striking the walls and varying the uniformity of concentration of plasma near the workpiece 18. In this way, the magnetic fields 26 keep the plasma spaced from the top section 24 of the chamber 12. The combination of the magnetic fields 26 and the helicon plasma 30 generated by the induction coil 14 form ECR region 32. The multipole confined plasma according to the present invention produces a quiescent plasma from which high density ion beams can be extracted, if desired.

Further according to the present invention, the RF coil 14 together with the plurality of magnetic dipoles 16 produce a plurality of helicon wave plasma sources in which the magnetic field varies from a value which is large enough to confine the plasma away from all the surfaces where the plasma is not being used and decreases towards the workpiece 18 to allow nearly damage-free plasma processing at the workpiece. At most RF frequencies, this decrease in magnetic field will include the magnetic field at which the RF power resonates with the electron cyclotron frequency. The plasma is produced for use at the workpiece while the magnetic field near other surfaces reduces the plasma diffusing to surfaces where it is not used, thereby leading to the very high efficiency of the present invention. The magnetic field value will depend on the intended operating pressure and the desired confinement, but in general should be greater than 200 Gauss. The resonant field is 5 Gauss at 13.56 MHz and 15 Gauss at 40 MHz.

As noted above, a plurality of helicon wave plasma sources are formed. The plurality of helicon sources and their positions result in a reactive plasma 30 which is distributed throughout the chamber 12. The number of helicon sources can be varied to fit the desired operating conditions and the result to be achieved.

Figure 2:
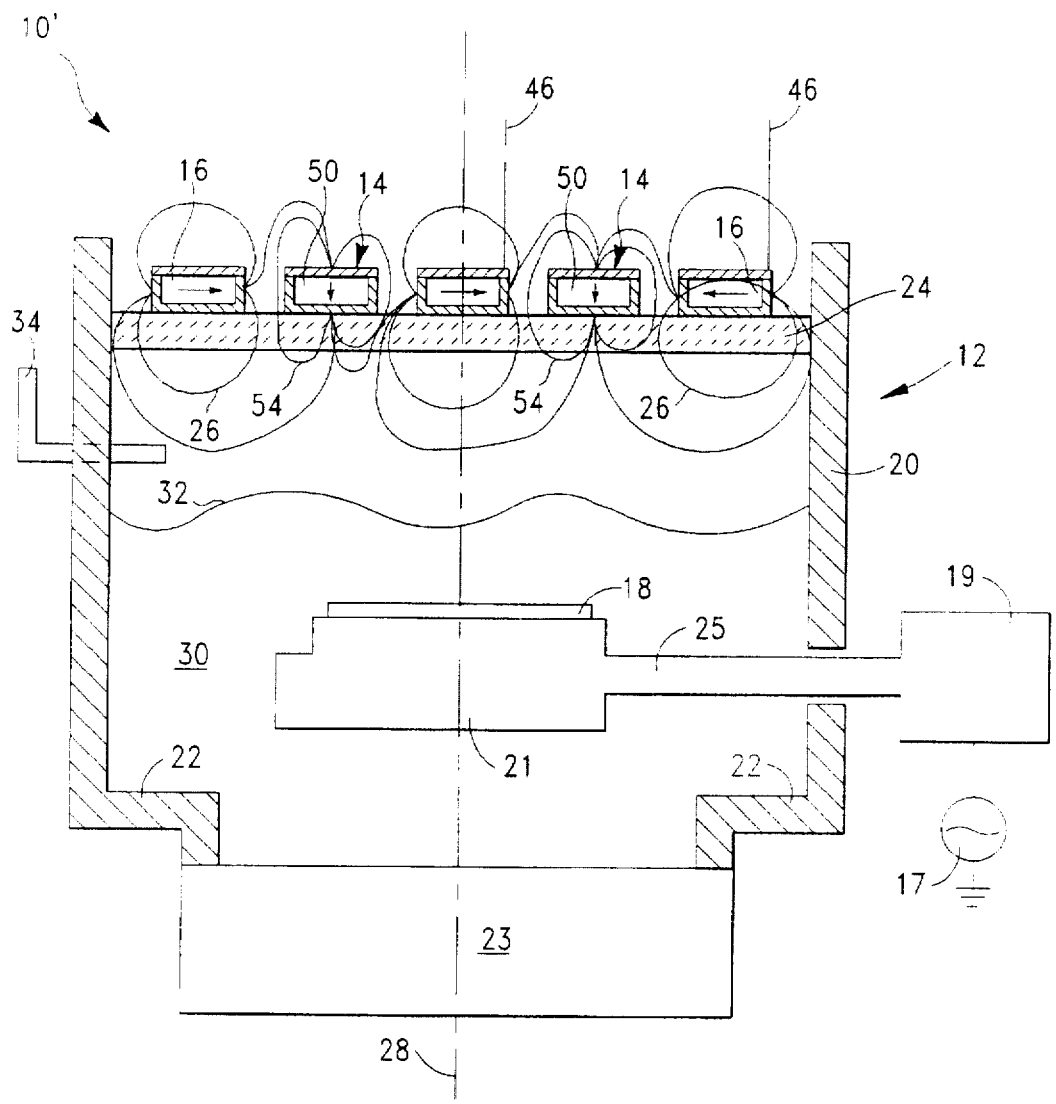
FIG. 2 is a sectional view of an first alternative embodiment of the plasma dry processing apparatus according to the present invention.

Referring now to FIG. 2, there is shown another embodiment of the present invention. Plasma dry processing apparatus 10' (in FIG. 2) is identical to plasma dry processing apparatus 10 (in FIG. 1) except that now all of the plurality of magnetic dipoles 16 do not have their magnetic fields parallel to the plasma. As shown in FIG. 2, there are a plurality of magnetic dipoles 16 which are oriented such that their north and south poles are perpendicular to the vertical axis 28 of the chamber 12 resulting in magnetic fields 26. However, in this embodiment of the invention there are now a plurality of magnetic dipoles 50 which have their north and south poles parallel to the vertical axis of the chamber 12. As shown in FIG. 2, the north poles of magnetic dipoles 50 are pointed toward the plasma resulting in magnetic fields 54. It is within the scope of the present invention for some or all of magnetic dipoles 50 to have their south poles pointed to the plasma. The plasma 30 is still confined away from the surface of the top section 24.

Figure 3:
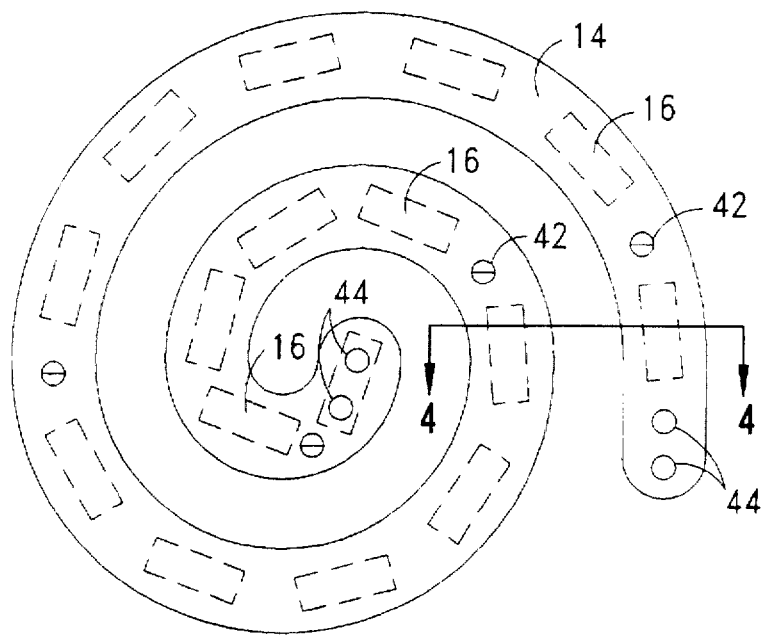
FIG. 3 is a plan view of the R.F. induction coil according to the present invention.
Figure 4:
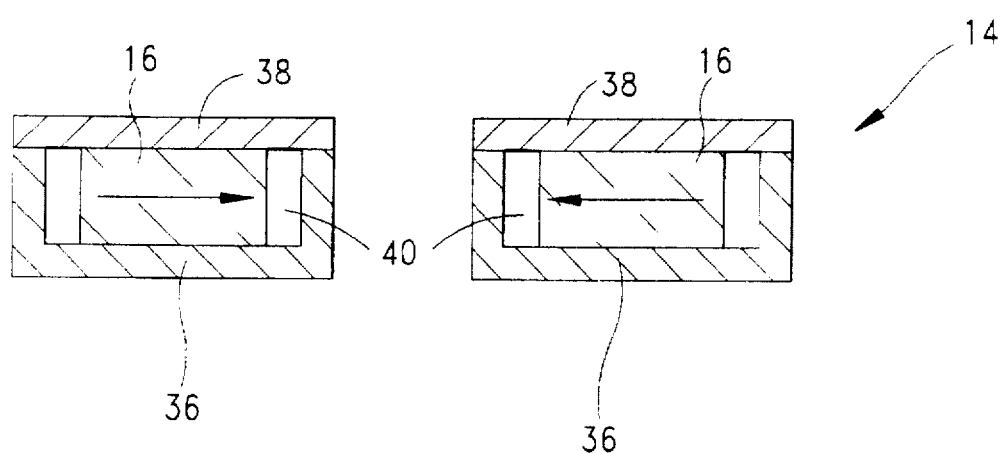
FIG. 4 is a cross-sectional view of the R.F. induction coil of FIG. 2 in the direction of arrows IV—IV.

Referring now to FIGS. 3 and 4, the induction coil 14 can be seen in more detail. The plurality of magnetic dipoles 16, most preferably permanent magnets, are located directly within the material of the induction coil itself. That is, the induction coil 14 includes a base portion 36 having a plurality of recesses 40 for receiving the plurality of magnetic dipoles 16. Once the plurality of magnetic dipoles 16 are situated within the recesses 40 of the planar, spiral induction coil 14, a cover portion 38, congruent in configuration with the base portion 36, covers the base portion 36, the recesses 40 and the plurality of magnetic dipoles 16. Fasteners 42 are used to hold the cover portion 38 in place with respect to the base portion 36. Cover portion 38 also includes contacts 44 (tapped holes) for connection of wires 46 (shown in FIG. 1).

The precise orientation of the plurality of magnetic dipoles 16 can be determined based on trial and error considered in conjunction with the type of magnetic field desired. Generally, the orientation of each of the magnetic dipoles 16 is varied from its neighbor. Similarly, the orientation of the magnetic dipoles 16 varies as the spiral loop of the induction coil 14 is traversed.

The antenna design or the antenna current can be adjusted to achieve a uniform plasma over the workpiece 18. In addition, the multipole magnetic field produces a surface confinement of the plasma which gives uniformity to the plasma over a wide pressure range of less than 0.1 mTorr to a few 10's of mTorr. For higher pressures, the antenna can easily be adjusted by adjusting the spacing between turns and the location of the turns to obtain the desired uniformity. In some cases, the uniformity in a given chamber can be achieved by combining an inductive plasma with a distributed helicon source, say at the periphery of the inductive source. Thus, the location of the energy deposition to the electrons and the location of the ionization can be tailored to give the desired uniformity.

The induction coil 14 shown in FIGS. 3 and 4 is a planar, spirally-shaped induction coil. The antenna (induction coil) can be changed to fit the desired uniformity and distribution of the plasma. For example, instead of the induction coil being spirally-shaped, it may be made of circular, oblong or rectangular segments to fit the particular need.

Further, as shown in FIGS. 1 to 4, each turn of the induction coil 14 contains the magnetic dipoles 16. As will become apparent hereafter, it is within the scope of the invention for only some of the turns to contain the magnetic dipoles 16.

Figure 5:
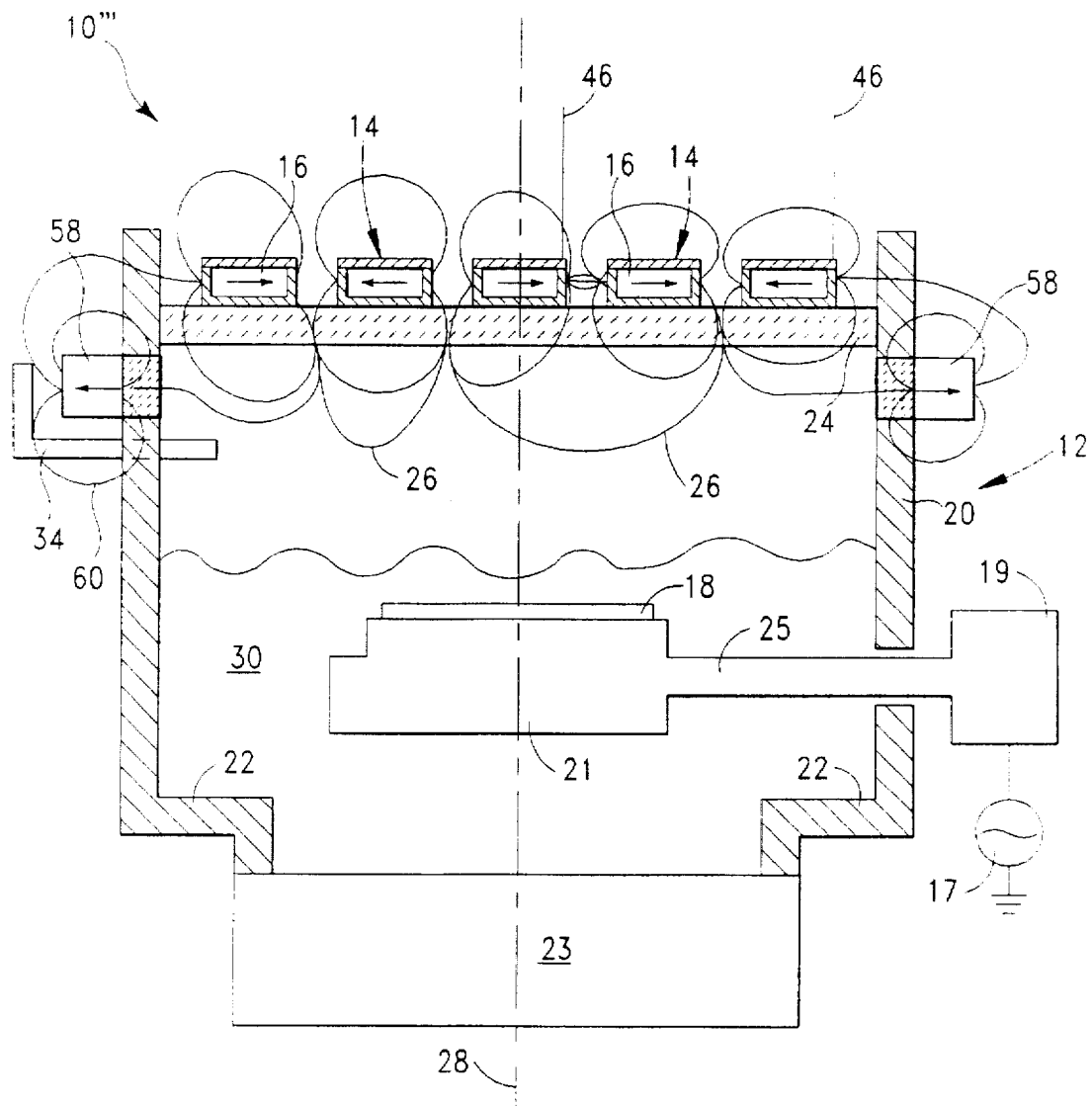
FIG. 5 is a sectional view of a second alternative embodiment of the plasma dry processing apparatus according to the present invention.

Referring now to FIG. 5, there is shown another embodiment of the present invention. Plasma dry processing apparatus 10'" (in FIG. 5) is identical to plasma dry processing apparatus 10 (in FIG. 1) except that now there is an additional plurality of magnetic dipoles 58 around the periphery of the chamber 12 and adjacent to vertical section 20. Each of the plurality of magnetic dipoles 58 have their magnetic fields 60 as shown in FIG. 5. The advantage to this embodiment of the invention is that the plurality of magnetic dipoles 58 provide additional confinement to the plasma 30.

Figure 6:
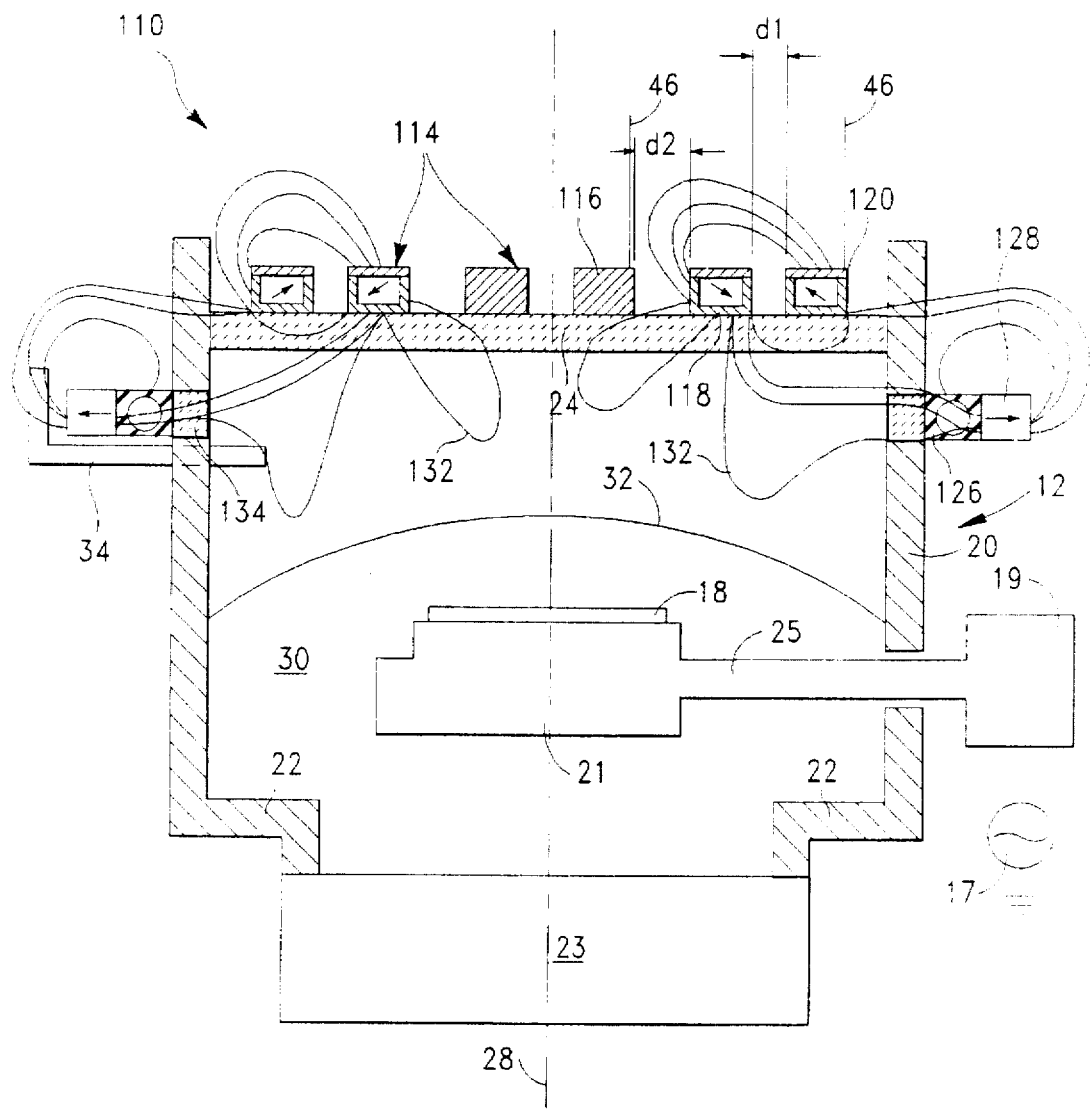
FIG. 6 is a sectional view of a third alternative embodiment of the plasma dry processing apparatus according to the present invention.

A further embodiment of the invention is shown in FIG. 6. The plasma dry processing apparatus 110 is similar to the previously discussed embodiments except that the embodiment in FIG. 6 utilizes a unique antenna magnetic dipole arrangement. Induction coil 114 is comprised of a plurality of turns, for example, 116, 118 and 120. The distance between turns 118 and 120, represented by $d_1$ is less than the distance between turns 116 and 118, represented by $d_2$. In addition, turns 118 and 120 contain a plurality of magnetic dipoles 122 and 124, respectively. Turn 116 specifically does not contain any magnetic dipoles. In addition to the induction coil 14 or 114, there is preferably a plurality of magnetic dipoles 128 which may be adhered to the periphery of the chamber 12 by, for example, a band of ferromagnetic material such as cold rolled steel. More preferably, there is now at least one antenna 126 encircling the chamber 12 and adjacent to vertical section 20 for applying an additional RF electromagnetic field. There may be only one antenna 126 encircling the chamber 12, as shown in FIG. 6, or there may be a plurality of antennas 126 encircling the chamber 12. The number of antennas 126 as well as the magnetic dipoles 128 associated with the antennas 126 will be dictated by the particular application, the efficiency of the apparatus 110 in generating the plasma 30, and the density of the plasma that is needed. Antenna 126 may contain cooling channel 130. Adjacent to antenna 126 is a further plurality of magnetic dipoles 128. Vertical section 20 should have a dielectric window 134 to accommodate the antenna 126. In a preferred embodiment, magnetic dipoles 122, 124 and 128 are oriented at angles of −60, 150 and 0 degrees, respectively. The resulting magnetic fields 132 produce ECR region 32.

Figure 7:
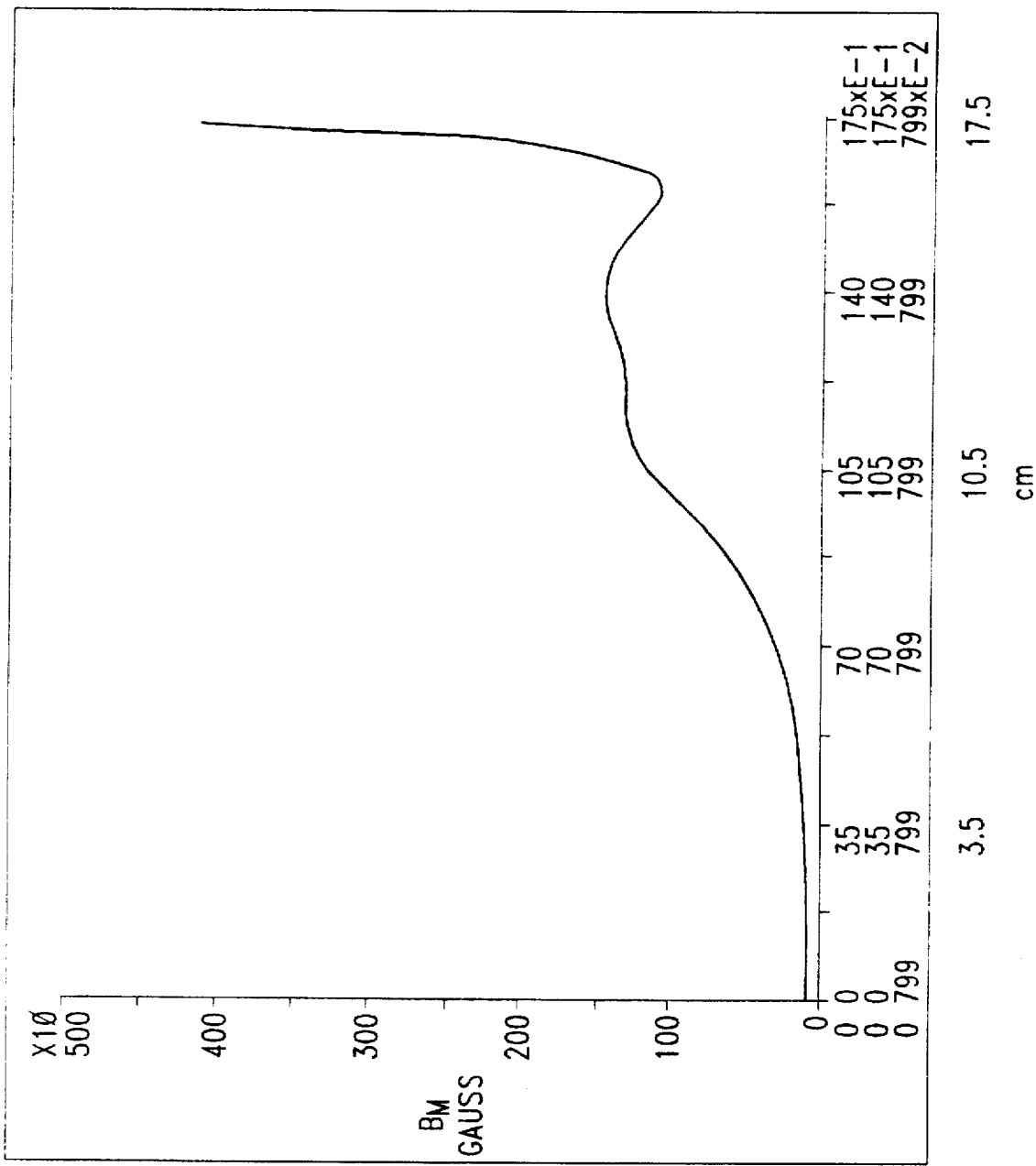
FIG. 7 is a graph of $B_m$ vs. distance across the chamber near the window for the embodiment of FIG. 6.
Figure 8:
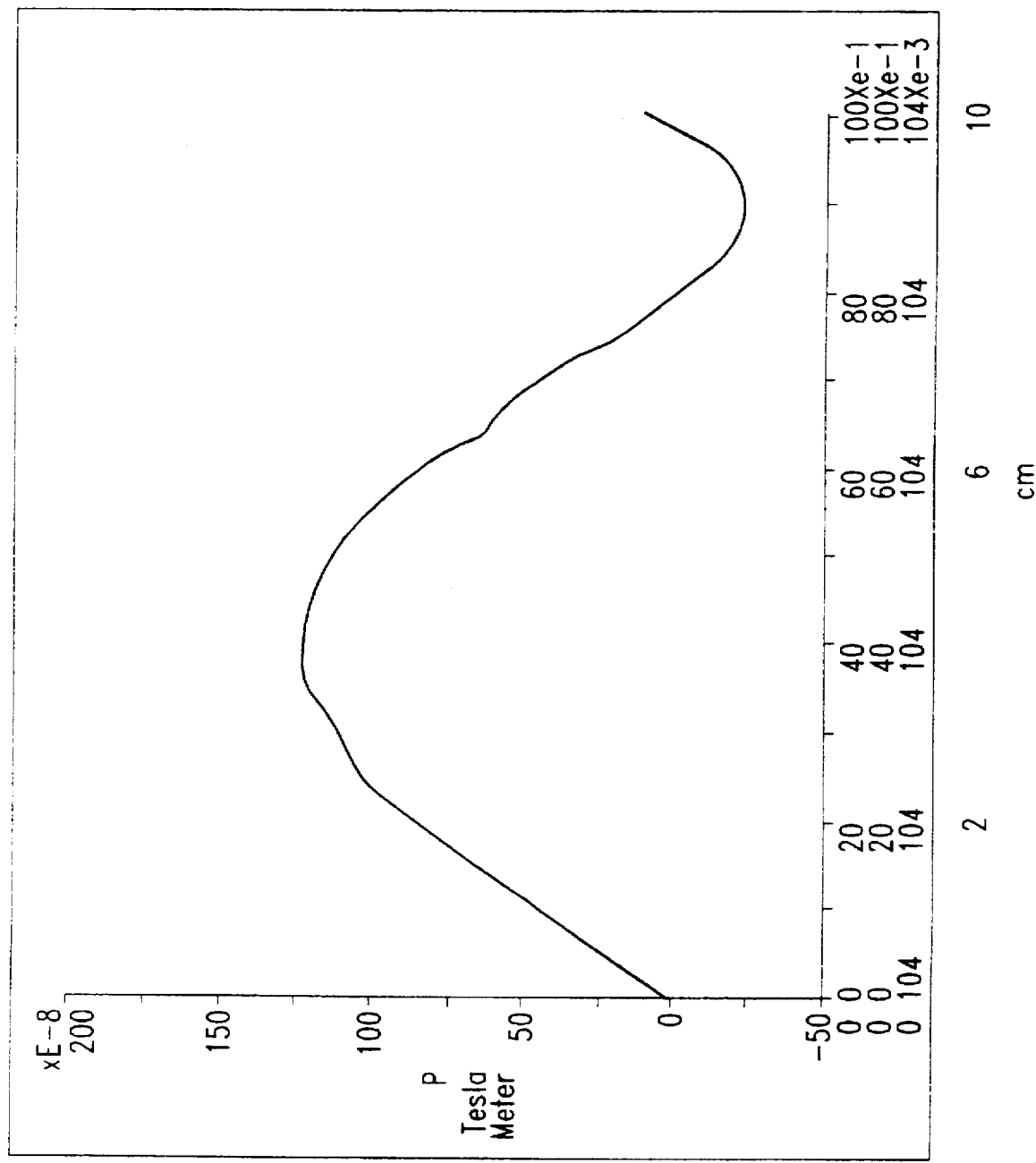
FIG. 8 is a graph of magnetic potential, P, vs. distance across the wafer for the embodiment of FIG. 6.

FIG. 7 shows the magnetic field ($B_m$) at the bottom of the top section 24 for the embodiment in FIG. 6. $B_m$ decreases from about 400 Gauss near vertical section 20 to about zero at centerline 28 of the chamber 12. FIG. 8 shows the magnetic potential (P) at the workpiece. An advantage of this embodiment is that there is zero magnetic potential at the workpiece edge. In general, the orientation of the magnetic dipoles 122, 124 and 128 are such that the magnetic fields perpendicular to the workpiece 18 at the workpiece 18 nearly cancel each other. Thus, the magnetic potential across the workpiece 18 is almost zero as shown in FIG. 8. In addition, a well-confined magnetron plasma is produced under the outer part of the induction coil 14, which gives the plasma stability at low pressure and electron densities. The magnetic field of magnetic dipoles 128 also radially configures the plasma 30 near the top section 24 and can increase the plasma uniformity in the plasma 30.

Figure 9A:
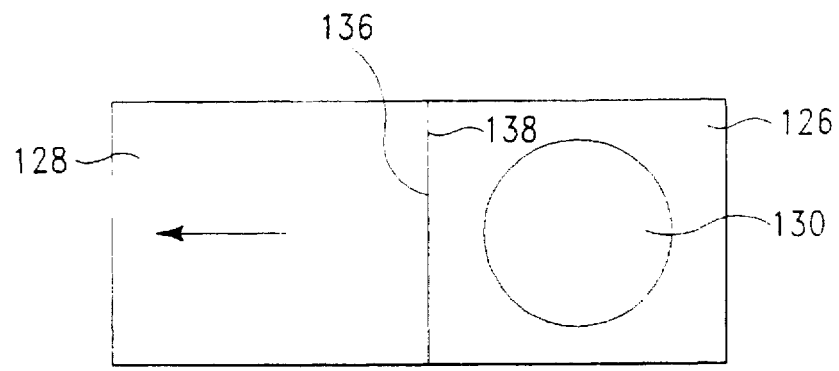
FIG. 9A is a cross sectional views of the antenna and magnetic dipole shown in FIG. 6.

Referring now to FIG. 9A, there is shown an enlargement of the at least one antenna 126 (from FIG. 6) with one of the plurality of magnetic dipoles 128. Water channel 130 is provided in the at least one antenna 126 for cooling if desired. Surface 136 of magnetic dipole 128 is in direct contact with surface 138 of antenna 126. The embodiment shown in FIG. 9A may be made by using cold or hot rolled steel stock (square or rectangular) with a water channel 130 bored lengthwise through the stock. Several lengths of stock may be connected by, for example, mechanical connectors or welding or brazing, to form the antenna 126, which may then be copper plated to a thickness of about 75 microns followed by being silver plated to a thickness of about 10 microns to get good RF conductivity. In general, the stock may be plated with an electrically conductive material including copper, silver, gold, platinum and alloys and mixtures thereof. If water cooling is not necessary, water channel 130 need not be made in the steel stock.

If desired, surfaces 136 and 138 may be separated by ferrite 140 (about 1/16–1/8 inch thick) for electrically isolating magnetic dipole 128 from antenna 126.

Magnetic dipoles 128 may also be copper and silver plated so that they don't absorb electrical energy.

Figure 9B:
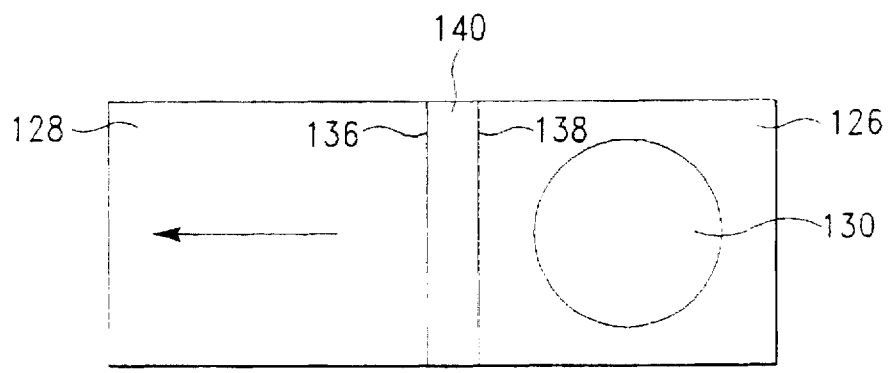
FIG. 9B shows an additional intermediate ferrite layer.

It is most preferred that magnetic dipole 128 be directly against antenna 126, except in the instance where ferrite 140 is interposed between the magnetic dipole 128 and antenna 126 as shown in FIG. 9B.

Figure 10:
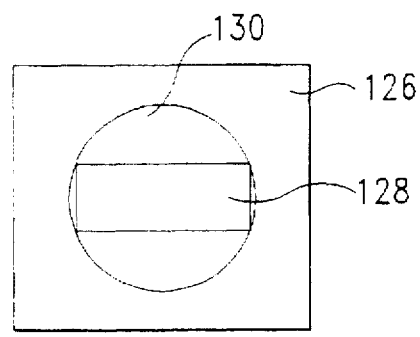
FIG. 10 is a cross sectional view of an alternative arrangement of the antenna and magnetic dipole shown in FIG. 6.

Each of the plurality of magnetic dipoles 128 is situated against, preferably directly against, the at least one antenna 126 as discussed previously. In FIG. 10, however, the magnetic dipoles 128 are located within the water channel 130 in the at least one antenna 126. Water channel 130 should be sized to allow enough water volume to move through the water channel 130 and around magnetic dipoles 128 so as to provide sufficient cooling capacity. Square or rectangular copper tubing may be used for the antenna 126. After inserting the magnetic dipoles 128, lengths of the copper tubing may be mechanically connected or brazed. The resulting structure may then be silver plated to a thickness of about 10 microns.

The structures shown in FIGS. 9A, 9B and 10 are applicable to inductive/helicon ion implantation sources as well.

Figure 11:
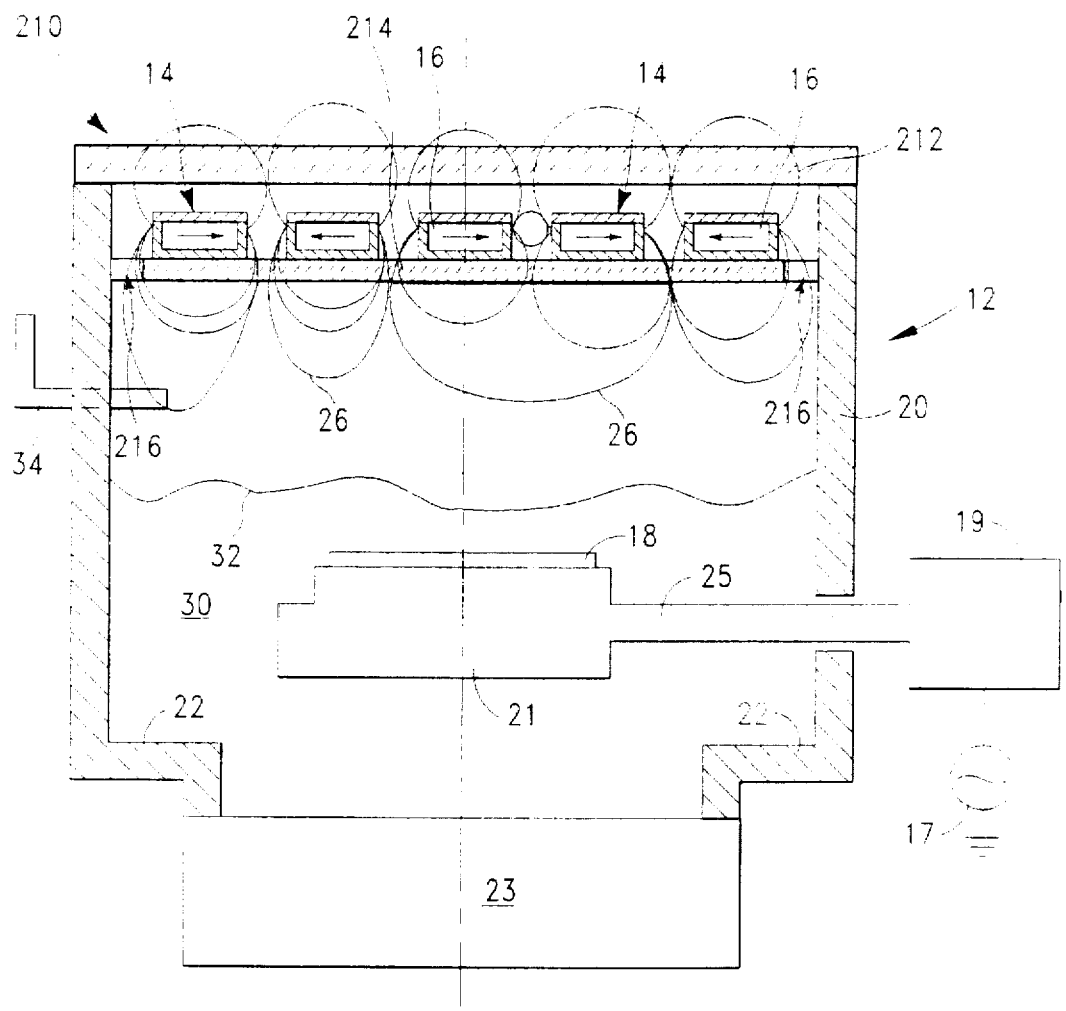
FIG. 11 is a sectional view of a fourth alternative embodiment of the plasma dry processing apparatus according to the present invention.

Referring now to FIG. 11, there is shown a further embodiment of the plasma dry processing apparatus. In the plasma dry processing apparatus 210, top section 212 (preferably made of a dielectric material) now encloses chamber 12. Induction coil 14 and the plurality of magnetic dipoles 16 now sit on dielectric window 214. In the previous embodiments discussed thus far, the top section (window) supported the induction coil 14 and plurality of magnetic dipoles 16 and also provided support to the chamber 12. Accordingly, the thickness of the top section was about 0.75 inches. It would be desirable to have the dielectric window as thin as possible for better magnetic coupling and to reduce resistive losses. Window 214 may now be 0.5 inches or less in thickness due to the fact that it is no longer providing structural support to the chamber 12. Preferably, window 214 has vacuum passages, indicated by arrows 216, for providing complete evacuation of the chamber 12.

Figure 12:
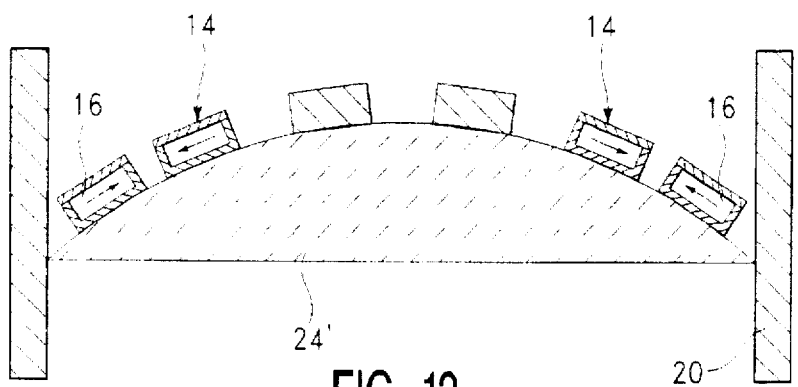
FIG. 12 is a sectional view of an alternative embodiment of the dielectric window supporting the induction coil in FIGS. 1, 2, 5 and 6.

FIG. 12 represents a modification of the embodiments of FIGS. 1, 2, 5 and 6. In those embodiments, the top section 24 does not have the optimal thickness. In FIG. 12, top section 24 has been replaced by a dome-shaped top section 24' which has the advantage of being thin at the edges so that the magnetic dipoles 16 near the edge only encounter a thickness of about 0.375 inches instead of the 0.75 inches in the top section 24 shown in FIGS. 1, 2, 5, and 6. As was the case with the FIG. 11 embodiment of the present invention (where a thin dielectric window 214 was utilized), better magnetic coupling can be achieved by using the dome-shaped top section 24' of FIG. 12.

The inventive apparatus is useful for both plasma etching and plasma coating processes, particularly in fields such as large scale integrated semiconductor devices and packages therefor. Other fields requiring microfabrication will also find use for this invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A plasma dry processing apparatus for producing a plasma with a resonance zone comprising:

a chamber for plasma processing at least one workpiece, said workpiece situated at a first end of said chamber;

an induction coil at a second end of said chamber, spaced from said workpiece, for providing a radio frequency induced electromagnetic field to generate a helicon plasma within said chamber;

a plurality of magnetic dipoles contained within the material of said induction coil, said magnetic dipoles having their fields directed towards the interior of, and producing a well-confined plasma within, said chamber, wherein said fields are confined adjacent to said second end of said chamber and keep said plasma spaced from said second end of said chamber.

2. The apparatus of claim 1 wherein each of said magnetic dipoles varies in its orientation of the north and south poles from its adjacent magnetic dipole.

3. The apparatus of claim 1 wherein said magnetic dipoles vary around the induction coil such that the north and south poles of said plurality of magnetic dipoles point parallel to the plasma.

4. The apparatus of claim 1 wherein said magnetic dipoles vary around the induction coil such that the north and south poles of every other of said plurality of magnetic dipoles point parallel to the plasma.

5. The apparatus of claim 1 wherein said induction coil is located on the exterior of said chamber.

6. The apparatus of claim 1 wherein said chamber comprises a dielectric material.

7. The apparatus of claim 1 wherein said chamber is circular in cross-section.

8. The apparatus of claim 1 wherein said chamber is rectangular in cross-section.

9. The apparatus of claim 1 wherein said induction coil comprises a base portion having recesses for receiving said plurality of magnetic dipoles and a cover portion congruent in configuration with said base portion for covering said base portion, said recesses and said plurality of magnetic dipoles.

10. The apparatus of claim 1 wherein said plasma processing comprises etching of the workpiece.

11. The apparatus of claim 1 wherein said plasma processing comprises selected deposition on the workpiece.

12. The apparatus of claim 1 further comprising a plurality of magnetic dipoles situated around the periphery of said chamber and proximate to said second end of said chamber, said magnetic dipoles having their fields directed towards the interior of said chamber for confining said plasma, wherein said fields are adjacent to the periphery of said chamber and keep said plasma spaced from said periphery of said chamber.

13. The apparatus of claim 1 further comprising at least one antenna encircling said chamber, and proximate to said second end of said chamber, for providing a radio frequency induced electromagnetic field to generate a helicon plasma within said chamber.

14. The apparatus of claim 13 further comprising a plurality of magnetic dipoles situated against said antenna, said magnetic dipoles having their fields directed towards the interior of said chamber for confining said plasma, wherein said fields are adjacent to the periphery of said chamber and keep said plasma spaced from said periphery of said chamber.

15. The apparatus of claim 14 wherein the portion of said chamber adjacent to said antenna comprises a dielectric material.

16. The apparatus of claim 14 wherein said at least one antenna further comprises an internal cooling channel and at least some of said plurality of magnetic dipoles are located within said cooling channel.

17. The apparatus of claim 14 further comprising a ferrite material interposed between said at least one antenna and at least one of said plurality of magnetic dipoles.

18. The apparatus of claim 1 wherein said induction coil comprises turns and said turns are equally spaced apart.

19. The apparatus of claim 1 wherein said induction coil comprises turns and said turns are unequally spaced apart.

20. The apparatus of claim 1 wherein portions of said induction coil are devoid of magnetic dipoles, comprises turns and said turns are equally spaced apart.

21. The apparatus of claim 1 wherein said chamber comprises, at said second end, an end portion for closing said second end of said chamber and a dielectric window, spaced from said end portion, for supporting said induction coil.

22. The apparatus of claim 21 wherein said dielectric window is thinner than said end portion.

23. The apparatus of claim 21 wherein said dielectric window has at least one perforation.

24. The apparatus of claim 1 wherein said chamber comprises, at said second end, an end portion for closing said second end of said chamber and for supporting said induction coil.

25. The apparatus of claim 24 wherein said end portion is dome-shaped in cross section.

26. An induction coil for providing a radio frequency induced electromagnetic field comprising:
 a coil shaped body for providing a radio frequency induced electromagnetic field; and
 a plurality of magnetic dipoles contained within the material of said coil shaped body.

27. The induction coil of claim 26 wherein said coil shaped body comprises a base portion having recesses for receiving said plurality of magnetic dipoles and a cover portion congruent in configuration with said base portion for covering said base portion, said recesses and said plurality of magnetic dipoles.

28. The induction coil of claim 26 wherein each of said magnetic dipoles varies in its orientation of the north and south poles from its adjacent magnetic dipole.

29. A magnetic field apparatus used in a plasma source comprising:
 a plasma source;
 a ferromagnetic material having an internal cooling channel proximate to said plasma source; and
 at least one magnetic dipole adhered directly to said ferromagnetic material.

30. The magnetic field apparatus of claim 29 wherein said ferromagnetic material is an antenna capable of generating an electromagnetic field.

31. The magnetic field apparatus of claim 29 wherein there are a plurality of said magnetic dipoles.

32. The magnetic field apparatus of claim 29 wherein the plasma source is an ion implantation source.

33. The magnetic field apparatus of claim 29 wherein the ferromagnetic material is coated with an electrically conductive material.

34. The magnetic field apparatus of claim 33 wherein said electrically conductive material is selected from the group consisting of copper, silver, gold, platinum and alloys and mixtures thereof.

35. A magnetic field apparatus used in a plasma source comprising:
 a plasma source;
 a ferromagnetic material having an internal cooling channel proximate to said plasma source, wherein said ferromagnetic material is an antenna capable of generating an electromagnetic field; and
 at least one magnetic dipole adhered directly to said ferromagnetic material.

36. A magnetic field apparatus used in a plasma source comprising:

a plasma source;

a ferromagnetic material having an internal cooling channel proximate to said plasma source wherein said ferromagnetic material is an antenna capable of generating an electromagnetic field;

a ferrite material adhered directly to said ferromagnetic material; and at least one magnetic dipole adhered directly to said ferrite material.

* * * * *